(12) United States Patent
Matsushita

(10) Patent No.: US 8,004,164 B2
(45) Date of Patent: Aug. 23, 2011

(54) PIEZOELECTRIC SINGLE CRYSTAL DEVICE

(75) Inventor: Mitsuyoshi Matsushita, Chiba (JP)

(73) Assignee: JFE Mineral Company, Ltd., Tokyo (JP)

(*) Notice: Subject to any disclaimer, the term of this patent is extended or adjusted under 35 U.S.C. 154(b) by 0 days.

(21) Appl. No.: 12/450,164

(22) PCT Filed: Apr. 14, 2008

(86) PCT No.: PCT/JP2008/057640
§ 371 (c)(1),
(2), (4) Date: Dec. 22, 2009

(87) PCT Pub. No.: WO2008/142933
PCT Pub. Date: Nov. 27, 2008

(65) Prior Publication Data
US 2010/0109489 A1    May 6, 2010

(30) Foreign Application Priority Data
May 18, 2007    (JP) ................. 2007-133251

(51) Int. Cl.
*H01L 41/08* (2006.01)
(52) U.S. Cl. .......... 310/368; 310/357; 310/358
(58) Field of Classification Search ......... 310/328, 310/334, 357, 368, 35
See application file for complete search history.

(56) References Cited

U.S. PATENT DOCUMENTS

| 6,020,675 | A | 2/2000 | Yamashita et al. | |
| 6,756,238 | B2 * | 6/2004 | Ogawa et al. | 438/3 |
| 7,053,531 | B2 * | 5/2006 | Chisaka et al. | 310/334 |
| 2008/0238262 | A1 * | 10/2008 | Takeuchi et al. | 310/346 |
| 2010/0066207 | A1 * | 3/2010 | Saito | 310/335 |

FOREIGN PATENT DOCUMENTS

| JP | 54-8993 | * | 1/1979 | 310/368 |
| JP | A-9-83038 | | 3/1997 | |
| JP | A-9-84194 | | 3/1997 | |
| JP | 2008-109641 | * | 5/2008 | |

OTHER PUBLICATIONS

*Ultrasonic Technology*; 1999; pp. 2-9; vol. 11; No. 9; Japan Industrial Publishing Co., LTD.

* cited by examiner

*Primary Examiner* — Thomas Dougherty
(74) *Attorney, Agent, or Firm* — Oliff & Berridge, PLC

(57) ABSTRACT

In a piezoelectric device that uses a vibration mode in a direction parallel to a polarization direction, a single crystal device that achieves an electromechanical coupling factor of 65% or more, which is more than the electromechanical coupling factor (about 60%) of the existing flat plane type piezoelectric single crystal device in that vibrational direction, is provided by performing certain treatment to its device plane. Specifically, a piezoelectric portion having a comb-shaped structure in which a plurality of slits are formed with a certain arrangement pitch on either of device planes whose polarization direction is their normal direction, the slits having a depth extending in a direction substantially perpendicular to the device plane and being filled with an insulating material, is formed to achieve 65% or more of an electromechanical coupling factor in a direction parallel to the polarization direction.

5 Claims, 5 Drawing Sheets

PIEZOELECTRIC SINGLE CRYSTAL DEVICE

FIELD OF THE INVENTION

The present invention relates to a piezoelectric single crystal device. Specifically, the present invention relates to a piezoelectric single crystal device composed of a piezoelectric single crystal material that uses a vibration mode in a direction parallel to a polarization direction (or PD). The attention is paid to improving an electromechanical coupling factor in the vibrational direction by providing certain treatment to its device plane.

DESCRIPTION OF THE RELATED ARTS

For a piezoelectric single crystal device, assuming that the longitudinal direction (the direction parallel to c) of, for example, a cuboid with c>>a and b shown in FIG. 1 is a polarization direction 3 (or PD), the conversion efficiency between electric energy and mechanical energy that relates to the magnitude of vibration in a polarization direction 3 (longitudinal vibration mode) when a voltage is applied in the polarization direction is proportional to the square root of electromechanical coupling factor $k_{33}$ in the longitudinal vibration mode. Therefore, higher electromechanical coupling factor $k_{33}$ means higher efficiency. In addition to the cuboid, the piezoelectric single crystal device may have a shape such as a plate or a disc. The electromechanical coupling factor can be determined for each shape in the same manner.

Examples of the known piezoelectric single crystal material include a solid solution (referred to as PZN-PT or PZNT) of zinc lead niobate ($Pb(Zn_{1/3}Nb_{2/3})O_3$) and lead titanate ($PbTiO_3$) and a solid solution (referred to as PMN-PT or PMNT) of magnesium lead niobate ($Pb(Mg_{1/3}Nb_{2/3})O_3$) and lead titanate ($PbTiO_3$).

For example, Ultrasonic TECHNO vol. 11 No. 9 (1999) pp. 11, Japan Industrial Publishing Co., LTD. discloses a plate-shaped piezoelectric single crystal device (hereinafter referred to as "flat plane type piezoelectric single crystal device") having a desired device area and thickness and a width of several tens of millimeters. The piezoelectric single crystal device can be easily made. However, the electromechanical coupling factor $k_t$ in a direction parallel to the polarization direction when the device is polarized in a direction normal to the flat plane is about 60% at most. The electromechanical coupling factor $k_t$ of such a device is equal to or only several percent higher than that of a zircon lead titanate ($Pb(Zr,Ti)O_3$) (PZT) sintered polycrystal piezoelectric device, zircon lead titanate being an existing piezoelectric material. Thus, such a device does not have sufficient piezoelectric properties.

An object of the present invention is to provide a piezoelectric single crystal device that uses a vibration mode in a direction parallel to a polarization direction and in which an electromechanical coupling factor better than the electromechanical coupling factor $k_t$ in a direction parallel to the polarization direction of the existing flat plane type piezoelectric single crystal device can be easily obtained by providing certain treatment to its device plane. Herein, $k_t$ is normally used to represent an electromechanical coupling factor in a direction parallel to the polarization direction of a flat plane type piezoelectric single crystal device.

SUMMARY OF THE INVENTION

The summary of the present invention for achieving the object described above is as follows.

(1) A piezoelectric single crystal device that uses a vibration mode in a polarization direction has a comb-shaped structure in which a plurality of slits are formed with a certain pitch on either of device planes whose polarization direction is their normal direction, the slits having a depth extending in a direction substantially perpendicular to the device plane and being filled with an insulating material, wherein an electromechanical coupling factor in a direction parallel to the polarization direction is 65% or more.

(2) In the piezoelectric single crystal device described in (1), the arrangement pitch of the slits is 1.0 time or less the thickness in the polarization direction of the piezoelectric single crystal device, and the depth of the slits is 0.25 to 0.5 times the thickness in the polarization direction of the piezoelectric single crystal device.

(3) The piezoelectric single crystal device described in (1) or (2) is composed of a solid solution having a composition of $xPb(A1, A2, \ldots, B1, B2, \ldots)O_3+(1-x)PbTiO_3$ (where x is a mol fraction and $0<x<1$), where A1, A2, ... is one or more elements selected from the group consisting of Zn, Mg, Ni, Cd, In, Y, and Sc and B1, B2, ... is one or more elements selected from the group consisting of Nb, Ta, Mo, and W, the piezoelectric single crystal device having a complex perovskite structure.

(4) In the piezoelectric single crystal device described in (3), the solid solution constituting the piezoelectric single crystal device further contains 0.5 ppm by mass to 5% by mass of one or more elements selected from the group consisting of Cr, Mn, Fe, Co, Al, Li, Ca, Sr, and Ba.

According to the present invention, a piezoelectric single crystal device that uses a vibration mode in a direction parallel to a polarization direction includes a plurality of slits formed with a certain arrangement pitch on either of device planes whose polarization direction is their normal direction, the slits having a depth extending in a direction substantially perpendicular to the device plane and being filled with an insulating material. Accordingly, a piezoelectric single crystal device that easily achieves an electromechanical coupling factor better than the electromechanical coupling factor $k_t$ in a direction parallel to the polarization direction of the existing flat plane type piezoelectric single crystal device can be provided. In view of the fact that the electromechanical coupling factor of the existing flat plane type piezoelectric single crystal device and zircon lead titanate (PZT) sintered polycrystal piezoelectric device is about 60% at most, since the conversion efficiency is proportional to the square of the electromechanical coupling factor, an electromechanical coupling factor of 65% or more means an efficiency 1.2 times or higher than before. This indicates the effectiveness of the piezoelectric single crystal device of the present invention.

REFERENCE NUMERALS

| | |
|---|---|
| 10 | piezoelectric (single crystal) device material |
| 10A | piezoelectric single crystal device of the present invention |
| 10B | flat plane type piezoelectric (single crystal) device |
| 11 | slit |
| 12 | electrode |
| 13 | insulating material |
| L | slit arrangement pitch |
| D | slit width |
| t | slit depth |
| T | thickness in a polarization direction of a device |
| PD | polarization direction |

EMBODIMENT FOR CARRYING OUT THE INVENTION

A flat plane type piezoelectric single crystal device can be easily made. However, the electromechanical coupling factor $k_t$ in the thickness direction of the device that is parallel to the polarization direction of the piezoelectric device when the device is polarized in a direction normal to the flat plane is about 60% at most. The electromechanical coupling factor $k_t$ of such a device is equal to or only several percent higher than that of a zircon lead titanate (PZT) sintered polycrystal piezoelectric device, which is an existing piezoelectric material. This is because, although the flat plane type piezoelectric single crystal device is polarized in a direction perpendicular to its crystal face inherent in a single crystal material that is selected as a device plane, the achieved electromechanical coupling factor $k_t$ in the thickness direction is not inherent in the crystal direction of the single crystal piezoelectric material, but is constituted by a complex vibration mode in which many vibration modes are mixed. Accordingly, it is believed that the flat plane type piezoelectric single crystal device does not have a good electromechanical coupling factor in the thickness direction that is inherent in the crystal direction of the single crystal material. In an investigation conducted by the present inventor regarding the problem described above, it was found that a piezoelectric single crystal device that has an electromechanical coupling factor closer to the good electromechanical coupling factor which is inherent in the single crystal device piezoelectric material and that easily achieves an electromechanical coupling factor better than that of the existing flat plane type piezoelectric single crystal device could be provided by forming a plurality of slits on the device plane with a certain arrangement pitch, the slits being filled with an insulating material. Thus, the present invention has been completed.

Figure 1:
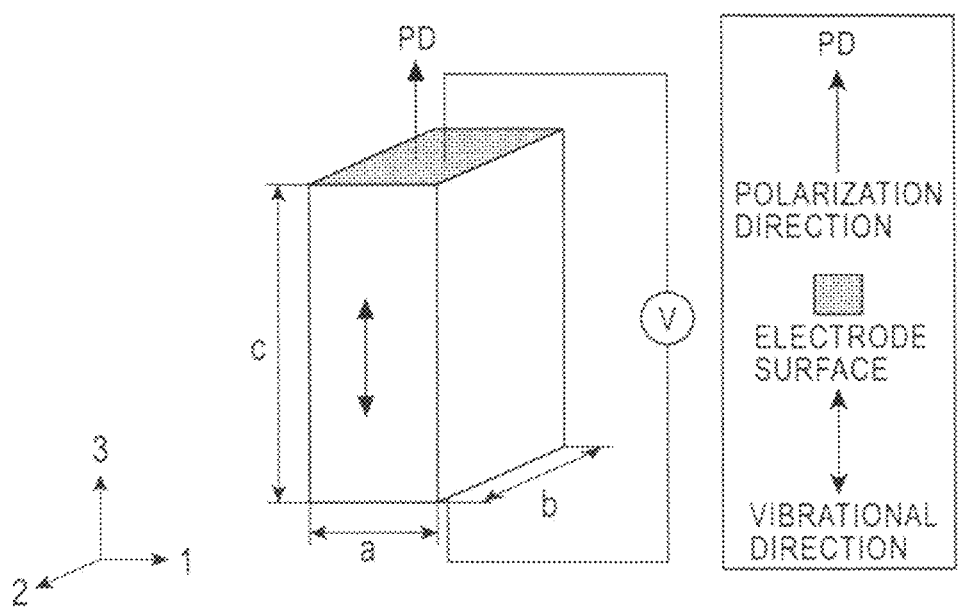
FIG. 1 is a diagram showing a direction and a shape of a common piezoelectric device that uses an electromechanical coupling factor $k_{33}$ in a direction parallel to a polarization direction.
Figure 2A:
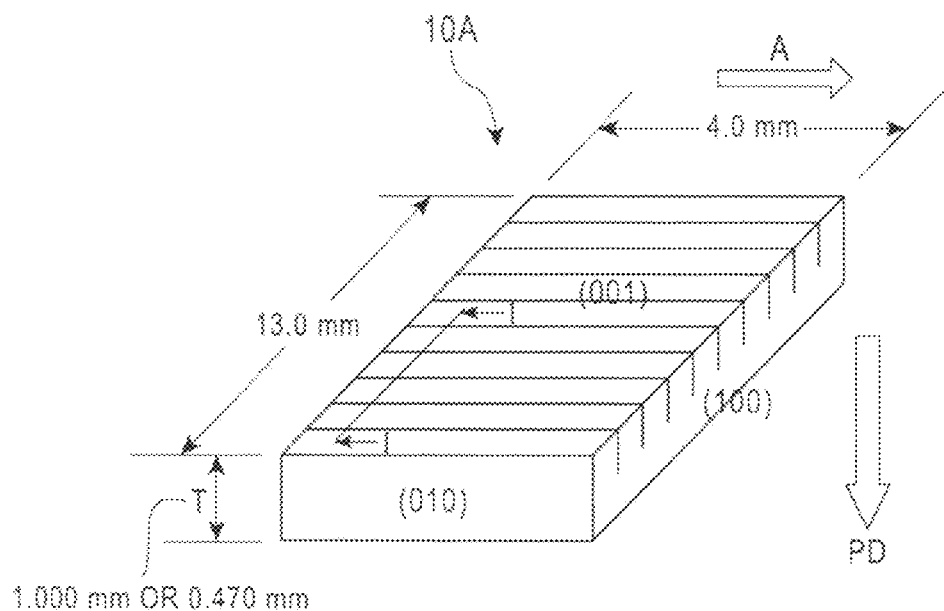
FIG. 2A is a perspective view showing a direction and a shape of a piezoelectric single crystal device material according to the present invention.
Figure 2B:
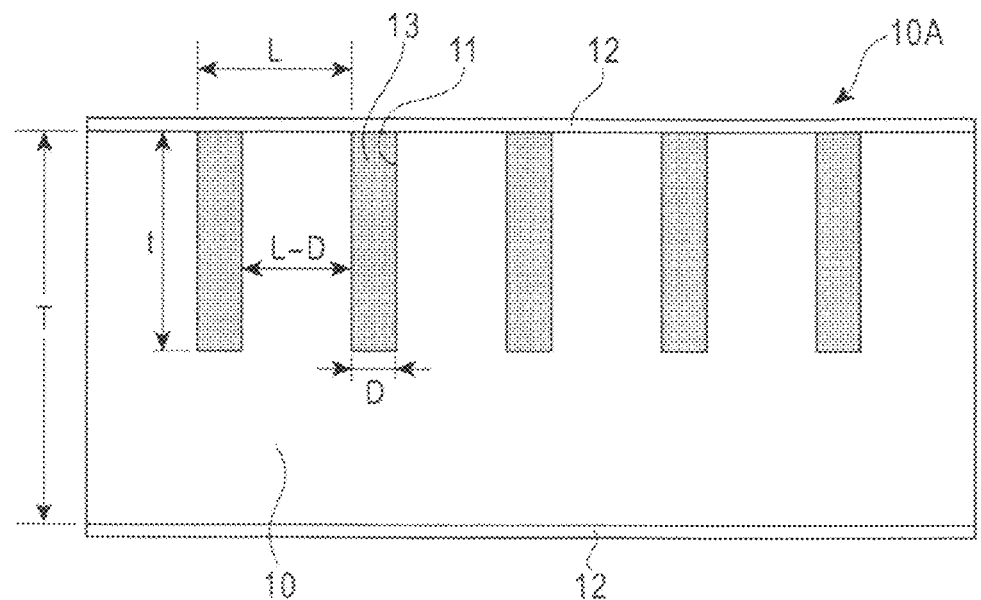
FIG. 2B is a sectional view taken along line I-I of FIG. 2A, showing electrodes disposed on both device planes of the piezoelectric single crystal device material.

The limitation reasons of a piezoelectric single crystal device of the present invention will now be described. In the piezoelectric single crystal device of the present invention that uses a vibration mode in a polarization direction, a comb-shaped structure needs to be formed by forming a plurality of slits with a certain pitch on either of the device planes whose polarization direction is their normal direction, the slits having a depth extending in a direction substantially perpendicular to the device plane and being filled with an insulating material. By forming the comb-shaped structure as shown in FIGS. 2A and 2B, the electromechanical coupling factor of a device structure that is separated by the slits filled with an insulating material becomes closer to the good electromechanical coupling factor in the thickness direction that is inherent in the crystal direction of the single crystal material. Therefore, a good electromechanical coupling factor in a direction parallel to the polarization direction of the entire device can be easily obtained compared with the electromechanical coupling factor of the existing flat plane type piezoelectric single crystal device. The direction of the slits needs to be a direction substantially perpendicular to the device plane in order to ensure the strength of the comb-shaped structure by ensuring the thickness thereof in the vibrational direction when the processed comb-shaped structure vibrates.

The insulating material preferably has a specific resistance that is equal to or higher than that of the piezoelectric material and a relative dielectric constant that is 1/10 or less that of the piezoelectric material. Examples of the insulating material include waxes and epoxy materials. The purpose of this patent is to obtain characteristics similar to those of a strip sample. When the material (e.g., wax) with which the slits are filled has a specific resistance lower than that in an uncut dummy strip portion of a piezoelectric body, a voltage drop between "an electrode and (the filling material and the strip portion of the piezoelectric body)" is decreased, and the strip portion is subjected to an electric field from various directions that is generated when the filling material functions as an electrode. As a result, the polarization direction is differentiated in the strip portion. This means that polarization cannot be performed in a desired direction. Accordingly, the material with which slits are filled needs to have a specific resistance equal to or higher than that of the piezoelectric body. When the material (e.g., wax) with which the slits are filled has a relative dielectric constant equal to or higher than that in an uncut dummy strip portion of a piezoelectric body, the function of a vibrator may become the same as that of "a plate-shaped vibrator". Accordingly, the material with which the slits are filled preferably has a relative dielectric constant that is 1/10 or less that of the piezoelectric material. Waxes and epoxy materials meet these conditions. In addition, waxes and epoxy materials are not piezoelectric bodies, but are simply paraelectrics, which do not contribute to vibration.

In the present invention, the arrangement pitch L of the slits formed on the device plane is preferably 1.0 time or less the thickness T in the polarization direction of the piezoelectric single crystal device. As shown in FIGS. 2A and 2B, the arrangement pitch L of the slits formed on the device plane in the present invention is preferably 1.0 time or less the thickness T ($L/T \leq 1.0$) in the polarization direction of the piezoelectric single crystal device. If $L/T > 1.0$, the width (L−D) of a portion separated by slits in a device structure 10 becomes large and several vibration modes are mixed, which causes interference of these vibration modes. As a result, the electromechanical coupling factor in a direction parallel to the polarization direction of the entire piezoelectric single crystal device is decreased.

In the present invention, the depth t of the slits formed on the device plane is preferably 0.25 to 0.50 times the thickness T in the polarization direction of the piezoelectric single crystal device. As shown in FIG. 2B, the depth t of the slits formed on the device plane in the present invention is preferably 0.25 to 0.50 times the thickness T ($0.25 \leq t/T \leq 0.50$) in the polarization direction of the piezoelectric single crystal device. If $t/T < 0.25$, the depth of the slits is too low and several vibration modes are mixed, which causes interference of these vibration modes. As a result, the electromechanical coupling factor in a direction parallel to the polarization direction of the entire piezoelectric single crystal device is decreased. If $t/T > 0.50$, the strength for the vibration of a slit-processed device is declined and the breakage of the device may be caused during vibration.

As described later, the slits are processed using a precision cutting machine such as a dicing saw. Therefore, the width of the slits depends on the thickness of the blade of such a precision cutting machine. The width of the slits is not specified as long as the slits are completely filled with a filling material. Since the thickness of a blade commonly used for a dicing saw is 50 to 100 μm, the width of the slits is also about 50 to 100 μm.

Figure 3:
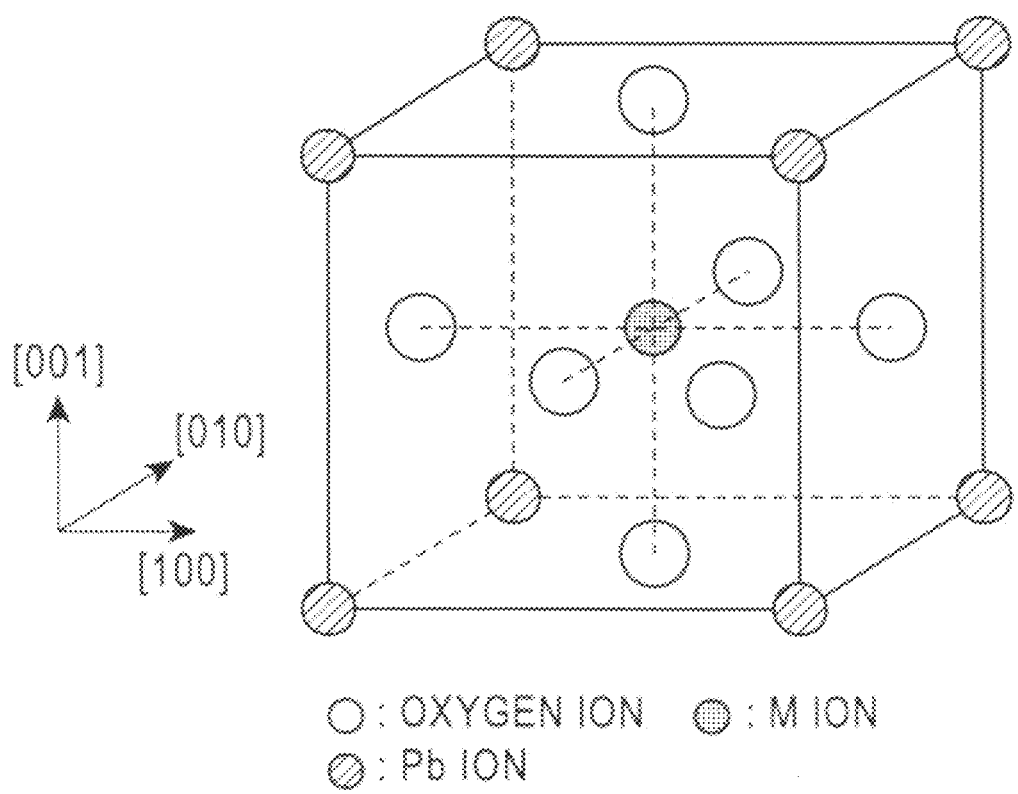
FIG. 3 is a schematic perspective view of a perovskite structure ($RMO_3$).

The crystal structure in the present invention is a perovskite structure ($RMO_3$) in which, as schematically shown in FIG. 3 that describes a unit cell of a solid solution single crystal, Pb ions are located in the corners of the unit cell, oxygen ions are located on the face centers of the unit cell, and an M ion is located at the body center of the unit cell. Furthermore, the crystal structure is preferably a complex perovskite structure in which the M ion located at the body center in FIG. 3 is not one kind of elemental ion, but is any two or more elemental ions (A1, A2, . . . , B1, B2, . . . ).

The single crystal device of the present invention preferably has the following composition and structure. The piezoelectric device of the present invention is composed of a solid solution having a composition of $xPb(A1, A2, \ldots, B1, B2, \ldots )O_3+(1-x)PbTiO_3$ (where x is a mol fraction and 0<x<1), where A1, A2, . . . is one or more elements selected from the group consisting of Zn, Mg, Ni, Cd, In, Y, and Sc and B1, B2, . . . is one or more elements selected from the group consisting of Nb, Ta, Mo, and W, the piezoelectric device having a complex perovskite structure. In this case, the device is suitable for a longitudinal vibration mode. In other words, the crystal structure is a perovskite structure ($RMO_3$) in which, as schematically shown in FIG. 3 that describes a unit cell of a solid solution single crystal, Pb ions are located in the corners of the unit cell, oxygen ions are located on the face centers of the unit cell, and an M ion is located at the body center of the unit cell. Preferably, the crystal structure is a complex perovskite structure in which the M ion located at the body center in FIG. 3 is not one kind of elemental ion, but is one or more elements selected from the group consisting of Zn, Mg, Ni, Cd, In, Y, and Sc and one or more elements selected from the group consisting of Nb, Ta, Mo, and W. In particular when a solid solution (referred to as PZN-PT or PZNT) of zinc lead niobate ($Pb(Zn_{1/3}Nb_{2/3})O_3$) and lead titanate ($PbTiO_3$) is used as a solid solution single crystal, the mol fraction x is preferably 0.80 to 0.98, more preferably 0.89 to 0.95. When a solid solution (referred to as PMN-PT or PMNT) of magnesium lead niobate ($Pb(Mg_{1/3}Nb_{2/3})O_3$) and lead titanate ($PbTiO_3$) is used as a solid solution single crystal, the mol fraction x is preferably 0.60 to 0.80, more preferably 0.64 to 0.78.

When a relative dielectric constant $\in r$ or a mechanical quality factor Qm need to be increased, 0.5 ppm by mass to 5% by mass of one or more elements selected from the group consisting of Cr, Mn, Fe, Co, Al, Li, Ca, Sr, and Ba may be added to the composition of the single crystal. If the additive amount is less than 0.5 ppm by mass, the effect due to the addition is not noticeable. If the additive amount is more than 5% by mass, it is difficult to obtain a single crystal and a polycrystal may be produced. By adding these elements such as Mn, Cr, Fe, and Co, a mechanical quality factor Qm can be improved or time degradation can be suppressed. By adding Sr and Ba, a relative dielectric constant Er is improved. The addition of Al and Li contributes to the suppression of the occurrence of a polycrystal region during single crystal growth. Moreover, the occurrence of pyrochlore phase during single crystal growth can be suppressed by adding Ca.

A preferred method for manufacturing the piezoelectric single crystal device of the present invention will now be described.

A method for manufacturing a piezoelectric single crystal device of the present invention includes a step of making a single crystal ingot; a step of cutting the single crystal ingot in a certain direction to obtain a single crystal device material (e.g., wafer) having a certain shape; a step of cutting the single crystal material to obtain a flat plane type single crystal device material; a step of forming a plurality of slits on the surface of the flat plane type single crystal device material with a certain arrangement pitch, the slits extending in a direction substantially perpendicular to the surface; a step of filling the slits with an insulating material; and a principal polarization step of polarizing the single crystal device material by applying an electric field in the polarization direction of the flat plane type single crystal device material under certain conditions.

The limitation reasons of the present invention in each of the steps will now be described.

(1) Making of Single Crystal Ingot

A method for making a single crystal ingot composed of a solid solution having a composition of $xPb(A1, A2, \ldots, B1, B2, \ldots )O_3+(1-x)PbTiO_3$ (where x is a mol fraction and 0<x<1), where A1, A2, . . . is one or more elements selected from the group consisting of Zn, Mg, Ni, Cd, In, Y, and Sc and B1, B2, . . . is one or more elements selected from the group consisting of Nb, Ta, Mo, and W or a method for making a single crystal ingot obtained by adding 0.5 ppm by mass to 5% by mass of one or more elements selected from the group consisting of Cr, Mn, Fe, Co, Al, Li, Ca, Sr, and Ba to the composition described above is exemplified as follows. One method is that, after a raw material prepared so as to satisfy the composition described above is dissolved in flux, it is solidified by decreasing temperature. Another method is that, after the raw material is melted by heating to a temperature higher than its melting point, it is solidified in one direction. Examples of the former method include a flux method, a Kyropulos method, and a top seeded solution growth (TSSG) method. Examples of the latter method include a melt Bridgman method and a Czochralski (CZ) method. In the present invention, the method for making a single crystal ingot is not limited.

(2) Determination of Crystallographic Directions of Single Crystal Ingot

The necessary crystallographic directions of the obtained single crystal ingot are determined. For example, in the case where the [001] direction of the single crystal ingot is assumed to be a polarization direction PD, the [001] axial direction of the single crystal ingot is roughly determined by a Laue method. The crystallographic directions such as the [010] axial direction and the [100] axial direction that are substantially perpendicular to the [001] axial direction are then roughly determined when necessary. Subsequently, the wafer, surface (the largest surface) (001) is polished, and an accurate direction is determined using an x-ray direction finder or the like to correct the gap on the polished surface.

(3) Rough Cutting (Making of Wafer Having Proper Thickness)

A single crystal is roughly cut using a cutting machine. For example, in the case where the [001] direction is assumed to be the polarization direction PD, the single crystal ingot is cut in a direction parallel to the polished surface (001) using a cutting machine such as a wire saw or an inner diamond saw to obtain plates (wafers) having a proper thickness. After the cutting, a chemical etching step may be performed using an etchant when necessary.

(4) Polishing (Making of Wafer Having Desired Thickness)

The wafer obtained after the rough cutting is then ground or polished using an abrasive machine or a grinding machine such as a lapping machine or a polishing machine to obtain a wafer having a desired thickness. After the grinding or polishing, a chemical etching step may be performed using an etchant when necessary.

(5) Making of Single Crystal Plate (Flat Plane Type Piezoelectric Single Crystal Device Material)

Figure 4:
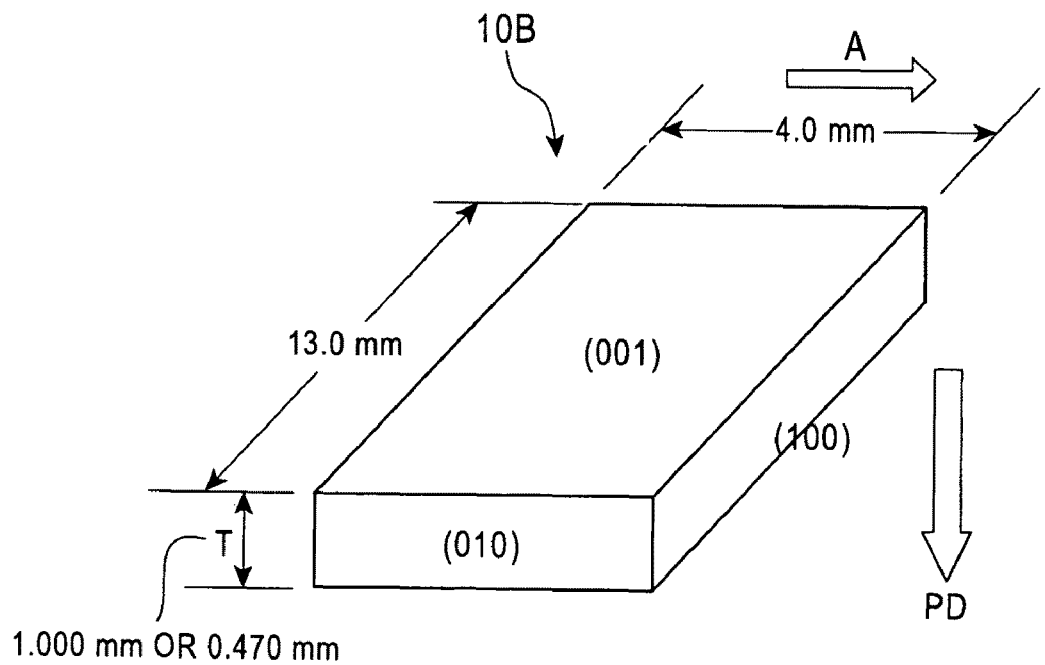
FIG. 4 is a perspective view showing a direction and a shape of a flat plane type piezoelectric single crystal device obtained by an existing method.

The wafer is cut to obtain a flat plane type piezoelectric single crystal device material shown in FIG. 4 using a precision cutting machine. For example, in the case where the [001] direction is assumed to be the polarization direction PD, since the wafer surface is the (001) surface, the flat plane type piezoelectric single crystal device material is made using a precision cutting machine such as a dicing saw or a cutting saw such that, for example, the (010) surface and the (100) surface that are substantially perpendicular to the (001) surface become end faces.

(6) Formation of Slits

A plurality of slits are formed on either of the device planes of the obtained flat plane type piezoelectric single crystal device material whose polarization direction is the normal direction, the slits having a depth extending in a direction substantially perpendicular to the device plane. For example, in the case where the [001] direction is assumed to be the polarization direction PD, as shown in FIG. 2A, the slits having a certain arrangement pitch L and a depth t are formed by incising the flat plane type piezoelectric single crystal device material in a direction parallel to one of the device end faces, that is, parallel to the [100] direction (A direction) or the [010] direction as well as in a direction perpendicular to the device plane, using a precision cutting machine such as a dicing saw.

As described above, the arrangement pitch L of the slits formed on the device plane is preferably 1.0 time or less the thickness T in the polarization direction of the piezoelectric single crystal device, and the depth t of the slits formed on the device plane is preferably 0.25 to 0.5 times the thickness T in the polarization direction of the piezoelectric single crystal device. The width of the slits is not particularly specified, and depends on the thickness of the blade of the precision cutting machine as described above. The width of the slits is not specified as long as the slits are completely filled with a filling material. Since the thickness of a blade commonly used for dicing saw is 50 to 100 μm, the width of the slits is also about 50 to 100 μm.

(7) Filling with Insulating Material

The slits formed in the piezoelectric single crystal material are filled with an insulating material. Examples of the insulating material include waxes and epoxy materials. For example, the filling may be performed by placing the piezoelectric single crystal material on a hot plate set to a temperature higher than the melting temperature of a wax and then by coating and penetrating the material with a melted wax.

(8) Making of Electrode

Before polarization treatment, electrodes are made on the upper and lower surfaces of the made piezoelectric single crystal device material by firing, for example, after a Cr—Au film (the first layer is a Cr layer having thickness of about 50 nm and the second layer is a Au layer having a thickness of about 200 to 400 nm) is formed by sputtering, a gold film having a thickness of 200 to 400 nm is formed by plasma-deposition, or a silver film having a thickness of 3 to 20 μm is formed by screen printing.

(9) Polarization Treatment

A single crystal just after its growth has electric dipoles oriented in various directions in accordance with each domain. Therefore, the single crystal does not have piezoelectricity and is not polarized. To impart piezoelectricity, polarization treatment that aligns the directions of electric dipoles according to each domain needs to be performed. In the polarization step of the present invention, a direct electric field of 350 to 1500 V/mm is preferably applied in a temperature range of 20 to 200° C. in the polarization direction 3 of the obtained piezoelectric single crystal device. When the temperature is less than 20° C., which is a lower limit of the preferred temperature range, or when the electric field is less than 350 V/mm, which is a lower limit of the applied electric field range, the polarization is insufficient. When the temperature is more than 200° C., which is an upper limit of the preferred temperature range, or when the electric field is more than 1500 V/mm, which is an upper limit of the applied electric field range, hyperpolarization (over pole) occurs and the piezoelectric properties of the piezoelectric single crystal device are degraded. In a different case, strain in the crystal is increased due to an excessive electric field, which may cause cracks or breakage of the piezoelectric single crystal device.

The polarization time is adjusted in accordance with the polarization treatment temperature and the applied electric field selected from the preferred range described above. The upper limit is desirably 180 minutes.

Alternatively, in the polarization step, a direct electric field of 250 to 500 V/mm may be applied in the polarization direction 3 of the obtained piezoelectric single crystal device material at a temperature higher than the Curie temperature Tc of the piezoelectric single crystal device material, preferably at a temperature of 190 to 220° C., and the piezoelectric single crystal device material may be then cooled to room temperature while the direct electric field is applied (electric field cooling). After the directions of electric dipoles are disordered by heating to a temperature higher than the Curie temperature Tc, the temperature is decreased to a temperature lower than the Curie temperature while a direct electric field is applied, to align the directions of electric dipoles. When the electric field is less than 250 V/mm, which is a lower limit of the preferred applied electric field range, the polarization is insufficient. When the electric field is more than 500 V/mm, which is an upper limit of the preferred applied electric field range, hyperpolarization (over pole) occurs and the properties of the piezoelectric single crystal device are degraded. In a different case, strain in the crystal is increased due to an excessive electric field, which may cause cracks or breakage of the piezoelectric single crystal device. The cooling rate is desirably adjusted so as not to cause cracks in the device during cooling.

Figure 5:
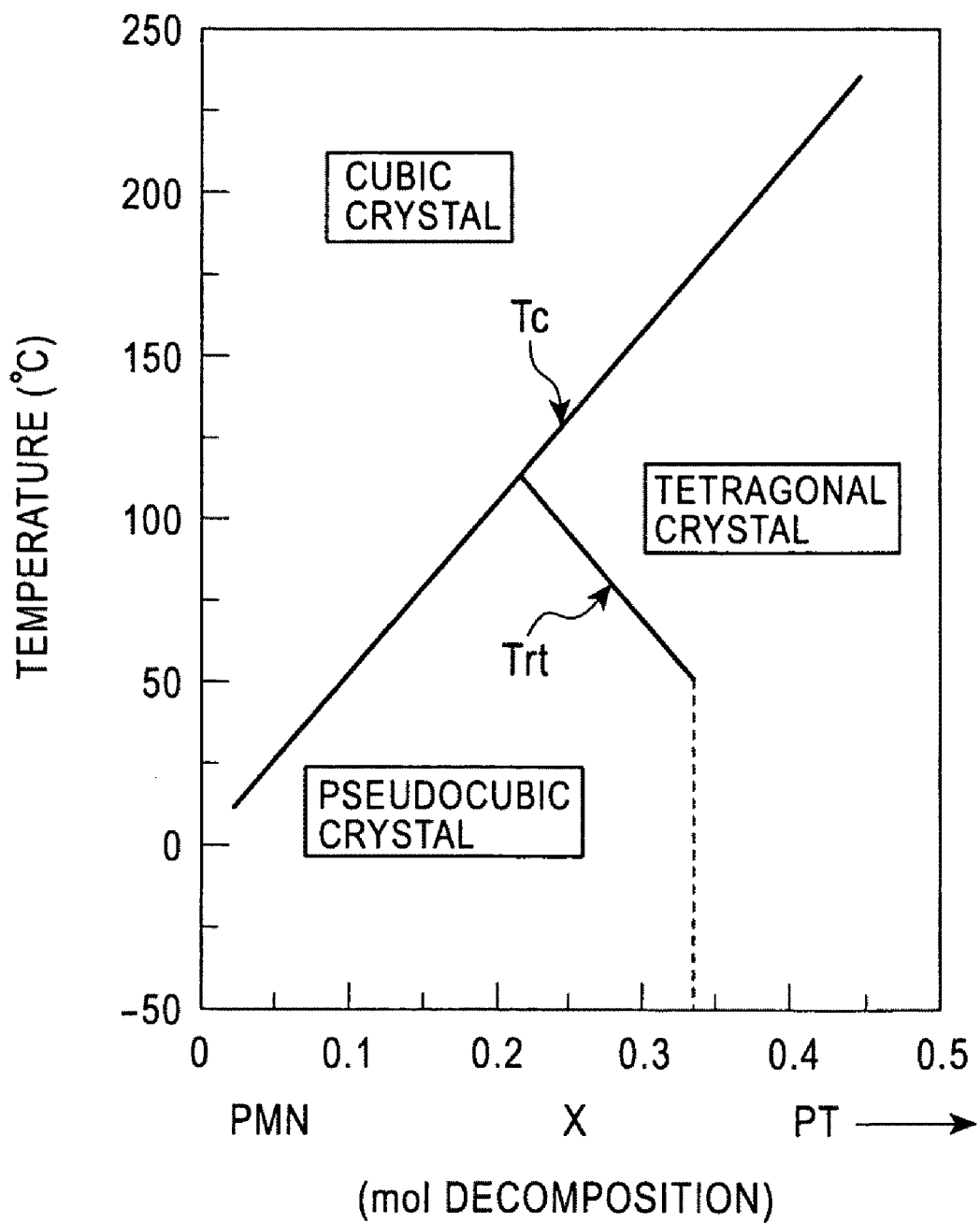
FIG. 5 is a phase diagram of PMN-PT (PMNT).

The Curie temperature Tc is a transition temperature that is determined in accordance with the structure and composition of a material (refer to line Tc in FIG. 5). At a temperature higher than the Curie temperature Tc, dielectric poles are oriented in various directions without any order and the piezoelectric single crystal device does not show piezoelectricity or dielectricity.

The above description is merely an example of an embodiment of the present invention, and various modifications can be made in Claims.

EXAMPLES

A trial manufacture of a piezoelectric single crystal device according to the present invention and the evaluation of its characteristics will now be described.

Example 1 and Comparative Example 1

In Example 1, a solid solution single crystal of 73 mol % magnesium lead niobate (PMN)+27 mol % lead titanate (PT) (composition formula: $Pb[(Mg,Nb)_{0.73}Ti_{0.27}]O_3$, PMN-PT or PMNT) was used as a material of a piezoelectric single crystal device. The shape or the like of the made piezoelectric single crystal device 10A is shown in FIG. 2A.

A piezoelectric single crystal device of the present invention was manufactured on the basis of the manufacturing method described above. A solid solution single crystal with a composition of $Pb[(Mg,Nb)xTi_{1-x}]O_3$ (x=0.73) was prepared, and a single crystal ingot was then obtained by a melt Bridgman method. After the accurate crystallographic directions of the single crystal ingot was determined by the x-ray Laue method using the x-ray direction finder, the single crystal ingot was cut using a wire saw to obtain disc wafers whose (001) surfaces are wafer surfaces and that have two different thicknesses of 1.20 mm and 0.550 mm. The disc wafers were then cut using a dicing saw to obtain flat wafers whose end faces are the (010) surface and the (100) surface that are substantially perpendicular to the (001) surface. Subsequently, the flat wafers were ground and polished using a lapping machine or a polishing machine until the thicknesses of the flat wafers reach 1.000 mm and 0.470 mm. Slits were formed on the (001) surface of each of the flat wafers in a direction parallel to the (010) surface (in the direction of an arrow A in FIG. 2) using a dicing saw equipped with a blade having a thickness of 50 μm. The slits were then filled with a wax (ALCOWAX819 available from NIKKA SEIKO CO., LTD.) to make the piezoelectric single crystal device material 10A shown in FIG. 2A. Cr—Au films (the first layer is a Cr layer having a thickness of about 50 nm and the second layer is a Au layer having a thickness of about 200 nm) were formed by sputtering on the upper and lower surfaces of the piezoelectric single crystal device material 10A. Subsequently, the piezoelectric single crystal device material 10A was polarized by applying an electric field of 700 V/mm for 30 minutes in the (001) direction using a polarization machine placed in a 40° C. thermostatic oven to manufacture a piezoelectric single crystal device. In this Example, the piezoelectric single crystal devices were manufactured so as to have various thicknesses T, slit depths t, and slit pitches L. Three samples having a thickness of 1.000 mm and three samples having a thickness of 0.470 mm were manufactured so as to be within the preferred range of the present invention (L/T≦1.0 and 0.25≦t/T≦0.5). In addition, two samples having a thickness of 1.000 mm and two samples having a thickness of 0.470 mm for Comparative Example 1 were manufactured so as to be outside the range of the present invention. In total, ten samples were manufactured.

An electromechanical coupling factor in a direction parallel to the polarization direction was measured to evaluate the characteristics of the manufactured piezoelectric single crystal device. The measurement values for Example 1 (slit arrangement pitch L, slit width D, comb portion width L–D, slit depth t, the ratio L/T of slit arrangement pitch to thickness, the ratio t/T of slit depth to thickness, resonant frequency fr, antiresonant frequency fa, and electromechanical coupling factor in a direction parallel to the polarization direction) are shown in Table 1. The electromechanical coupling factor was calculated from impedance curves and phases of vibration modes in the polarization direction that are obtained with an impedance/gain-phase analyzer (available from HP, model number: HP4194A), using a known calculating formula (refer to Standard of Electronic Materials Manufacturers Association of Japan: EMAS-6008 and 6100).

Comparative Example 2

A flat plane type piezoelectric single crystal device shown in FIG. 4 was manufactured for Comparative Example 2 to investigate its characteristics. A flat plane type piezoelectric single crystal device material 10B shown in FIG. 4 was manufactured by the same method as in Example 1 except that a step of forming slits on the device plane and a step of filling slits with an insulating material were not performed. Three samples having a thickness of 1.000 mm and three samples having a thickness of 0.470 mm were manufactured as the flat plane type piezoelectric single crystal device. In total, six samples were manufactured. The characteristics were measured by the same method as in Example 1. The measurement values for Comparative Example 2 (resonant frequency fr, antiresonant frequency fa, and electromechanical coupling factor $k_t$) are shown in Table 2.

The following is found from Tables 1 and 2. All the piezoelectric devices (Nos. 1 to 6) of Example 1 shown in Table 1 have an electromechanical coupling factor of 67.1 to 73.0%, which is 65% or more. In contrast, regarding the piezoelectric single crystal devices (Nos. 7 to 10) of Comparative Example 1 shown in Table 1 and the flat plane type piezoelectric single crystal devices of Comparative Example 2 shown in Table 2, the electromechanical coupling factor in a direction parallel to the polarization direction is 55.2% to 58.6%, which is 60% or less. This is the unsatisfactory characteristics of the piezoelectric devices that use the vibration mode in that direction.

Example 2 and Comparative Example 3

A piezoelectric single crystal device of Example 2 was manufactured by the same method as in Example 1 except that a solid solution single crystal of 60 mol % magnesium lead niobate (PMN)+40 mol % lead titanate (PT) (composition formula: $Pb[(Mg,Nb)_{0.60}Ti_{0.40}]O_3$, PMN-PT or PMNT) was used as a material of a piezoelectric single crystal device. In this Example, the piezoelectric single crystal devices were manufactured so as to have various thicknesses T, slit depths t, and slit pitches L. Three samples having a thickness of 1.000 mm and three samples having a thickness of 0.470 mm were manufactured so as to be within the preferred range of the present invention (L/T≦1.0 and 0.25≦t/T≦0.5). In addition, two samples having a thickness of 1.000 mm and two samples having a thickness of 0.470 mm for Comparative Example 3 were manufactured so as to be outside the range of the present invention. In total, ten samples were manufactured. The measurement values for Example 2 (slit arrangement pitch L, slit width D, comb portion width L–D, slit depth t, the ratio L/T of slit arrangement pitch to thickness, the ratio t/T of slit depth to thickness, resonant frequency fr, antiresonant frequency fa, and electromechanical coupling factor in a direction parallel to the polarization direction) are shown in Table 3.

Comparative Example 4

A piezoelectric single crystal device of Comparative Example 4 was manufactured by the same method as in Example 1, except that a solid solution single crystal of 60 mol % magnesium lead niobate (PMN)+40 mol % lead titanate (PT) (composition formula: $Pb[(Mg,Nb)_{0.60}Ti_{0.40}]O_3$, PMN-PT or PMNT) was used as a material of a piezoelectric single crystal device; and a step of forming slits on the device plane and a step of filling slits with an insulating material were not performed for the manufactured flat plane type piezoelectric single crystal device material. Three samples having a thickness of 1.000 mm and three samples having a thickness of 0.470 mm were manufactured as the flat plane type piezoelectric single crystal device. In total, six samples were manufactured. The characteristics were measured by the same method as in Example 1. The measurement values for Comparative Example 4 (resonant frequency fr, antiresonant frequency fa, and electromechanical coupling factor $k_t$) are shown in Table 4.

The following is found from Tables 3 and 4. All the piezoelectric devices (Nos. 1 to 6) of Example 2 shown in Table 3 have an electromechanical coupling factor of 65.7 to 73.2%, which is 65% or more. In contrast, regarding the piezoelectric single crystal devices (Nos. 7 to 10) of Comparative Example 3 shown in Table 3 and the flat plane type piezoelectric single crystal devices of Comparative Example 4 shown in Table 4, the electromechanical coupling factor in a direction parallel to the polarization direction is 55.1% to 57.8%, which is 60% or less. This is the unsatisfactory characteristics of the piezoelectric devices that use the vibration mode in that direction.

Example 3 and Comparative Example 5

A piezoelectric single crystal device of Example 3 was manufactured by the same method as in Example 1 except that a solid solution single crystal of 76 mol % magnesium lead niobate (PMN)+24 mol % lead titanate (PT) to which Ca was added so as to constitute a composition of 0.5% by mass (composition formula: Pb(Ca)[(Mg,Nb)$_{0.76}$Ti$_{0.24}$]O$_3$) was used as a material of a piezoelectric single crystal device. In this Example, the piezoelectric single crystal devices were manufactured so as to have various thicknesses T, slit depths t, and slit pitches L. Three samples having a thickness of 1.000 mm and three samples having a thickness of 0.470 mm were manufactured so as to be within the preferred range of the present invention (L/T≦1.0 and 0.25≦t/T≦0.5). In addition, two samples having a thickness of 1.000 mm and two samples having a thickness of 0.470 mm for Comparative Example 5 were manufactured so as to be outside the range of the present invention. In total, ten samples were manufactured. The measurement values for Example 3 (slit arrangement pitch L, slit width D, comb portion width L−D, slit depth t, the ratio L/T of slit arrangement pitch to thickness, the ratio t/T of slit depth to thickness, resonant frequency fr, antiresonant frequency fa, and electromechanical coupling factor in a direction parallel to the polarization direction) are shown in Table 5. A pyrochlore phase that is a heterogeneous phase was not produced in the piezoelectric single crystal ingot.

Comparative Example 6

A piezoelectric single crystal device of Comparative Example 6 was manufactured by the same method as in Example 3, except that a solid solution single crystal of 76 mol % magnesium lead niobate (PMN)+24 mol % lead titanate (PT) to which Ca was added so as to constitute a composition of 0.5% by mass (composition formula: Pb(Ca)[(Mg,Nb)$_{0.76}$Ti$_{0.24}$]O$_3$) was used as a material of a piezoelectric single crystal device; and a step of forming slits on the device plane and a step of filling slits with an insulating material were not performed for the manufactured flat plane type piezoelectric single crystal device material. Three samples having a thickness of 1.000 mm and three samples having a thickness of 0.470 mm were manufactured as the flat plane type piezoelectric single crystal device. In total, six samples were manufactured. The characteristics were measured by the same method as in Example 3. The measurement values for Comparative Example 6 (resonant frequency fr, antiresonant frequency fa, and electromechanical coupling factor k$_t$) are shown in Table 6. A pyrochlore phase that is a heterogeneous phase was not produced in the piezoelectric single crystal ingot.

The following is found from Tables 5 and 6. All the piezoelectric devices (Nos. 1 to 6) of Example 3 shown in Table 5 have an electromechanical coupling factor of 68.3 to 73.8%, which is 65% or more. In contrast, regarding the piezoelectric single crystal devices (Nos. 7 to 10) of Comparative Example 5 shown in Table 5 and the flat plane type piezoelectric single crystal devices of Comparative Example 6 shown in Table 6, the electromechanical coupling factor in a direction parallel to the polarization direction is 56.1% to 59.3%, which is 60% or less. This is the unsatisfactory characteristics of the piezoelectric devices that use the vibration mode in that direction.

Example 4 and Comparative Example 7

A piezoelectric single crystal device of Example 4 was manufactured by the same method as in Example 1 except that a solid solution single crystal of 66 mol % magnesium lead niobate (PMN)+66 mol % indium lead niobate (PIN)+34 mol % lead titanate (PT) to which Ca was added so as to constitute a composition of 0.5% by mass (composition formula: Pb(Ca)[(Mg,Nb,In)$_{0.66}$Ti$_{0.34}$]O$_3$) was used as a material of a piezoelectric single crystal device. In this Example, the piezoelectric single crystal devices were manufactured so as to have various thicknesses T, slit depths t, and slit pitches L. Three samples having a thickness of 1.000 mm and three samples having a thickness of 0.470 mm were manufactured so as to be within the preferred range of the present invention (L/T≦1.0 and 0.25≦t/T≦0.5). In addition, two samples having a thickness of 1.000 mm and two samples having a thickness of 0.470 mm for Comparative Example 7 were manufactured so as to be outside the range of the present invention. In total, ten samples were manufactured. The measurement values for Example 4 (slit arrangement pitch L, slit width D, comb portion width L−D, slit depth t, the ratio L/T of slit arrangement pitch to thickness, the ratio t/T of slit depth to thickness, resonant frequency fr, antiresonant frequency fa, and electromechanical coupling factor in a direction parallel to the polarization direction) are shown in Table 7. A pyrochlore phase that is a heterogeneous phase was not produced in the piezoelectric single crystal ingot.

Comparative Example 8

A piezoelectric single crystal device of Comparative Example 8 was manufactured by the same method as in Example 4, except that a solid solution single crystal of 66 mol % magnesium lead niobate (PMN)+66 mol % indium lead niobate (PIN)+34 mol % lead titanate (PT) to which Ca was added so as to constitute a composition of 0.5% by mass (composition formula: Pb(Ca)[(Mg,Nb,In)$_{0.66}$Ti$_{0.34}$]O$_3$) was used as a material of a piezoelectric single crystal device; and a step of forming slits on the device plane and a step of filling slits with an insulating material were not performed for the manufactured flat plane type piezoelectric single crystal device. Three samples having a thickness of 1.000 mm and three samples having a thickness of 0.470 mm were manufactured as the flat plane type piezoelectric single crystal device. In total, six samples were manufactured. The characteristics were measured by the same method as in Example 3. The measurement values for Comparative Example 8 (resonant frequency fr, antiresonant frequency fa, and electromechanical coupling factor k$_t$) are shown in Table 8. A pyrochlore phase that is a heterogeneous phase was not produced in the piezoelectric single crystal ingot.

The following is found from Tables 7 and 8. All the piezoelectric devices (Nos. 1 to 6) of Example 4 shown in Table 7 have an electromechanical coupling factor of 66.3 to 73.5%, which is 65% or more. In contrast, regarding the piezoelectric single crystal devices (Nos. 7 to 10) of Comparative Example 7 shown in Table 7 and the flat plane type piezoelectric single crystal devices of Comparative Example 8 shown in Table 8, the electromechanical coupling factor in a direction parallel to the polarization direction is 55.7% to 58.6%, which is 60% or less. This is the unsatisfactory characteristics of the piezoelectric devices that use the vibration mode in that direction.

INDUSTRIAL APPLICABILITY

According to the present invention, a piezoelectric single crystal device that uses a vibration mode in a direction parallel to a polarization direction includes a plurality of slits formed with a certain arrangement pitch on either of device planes whose polarization direction is their normal direction, the slits having a depth extending in a direction substantially perpendicular to the device plane and being filled with an insulating material. Accordingly, a piezoelectric single crystal device that easily achieves an electromechanical coupling factor better than the electromechanical coupling factor k$_t$ in a direction parallel to the polarization direction of the existing flat plane type piezoelectric single crystal device can be provided.

TABLE 1

X = 0.73

| | No. | Thickness T (mm) | Slit arrangement pitch L (mm) | Slit width D (mm) | Comb portion width L − D (mm) | Ratio of slit arrangement pitch to thickness L/T | Ratio of slit depth to thickness t/T | Resonant frequency fr (kHz) | Antiresonant frequency fa (kHz) | Electromechanical coupling factor % |
|---|---|---|---|---|---|---|---|---|---|---|
| Example 1 | 1 | 1.000 | 0.300 | 0.050 | 0.250 | 0.300 | 0.500 | 1450 | 2050 | 71.3 |
| | 2 | 1.000 | 0.550 | 0.050 | 0.500 | 0.550 | 0.500 | 1420 | 2100 | 73.0 |
| | 3 | 1.000 | 0.800 | 0.050 | 0.750 | 0.800 | 0.500 | 1500 | 2213 | 68.3 |
| | 4 | 0.470 | 0.200 | 0.050 | 0.150 | 0.426 | 0.266 | 3210 | 4350 | 71.6 |
| | 5 | 0.470 | 0.250 | 0.050 | 0.200 | 0.532 | 0.266 | 3490 | 4570 | 68.4 |
| | 6 | 0.470 | 0.350 | 0.050 | 0.300 | 0.745 | 0.266 | 3330 | 4300 | 67.1 |
| Comparative Example 1 | 7 | 1.000 | 1.200 | 0.050 | 1.150 | 1.200 | 0.500 | 1909 | 2280 | 58.6 |
| | 8 | 1.000 | 1.750 | 0.050 | 1.700 | 1.750 | 0.500 | 1935 | 2254 | 55.2 |
| | 9 | 0.470 | 0.550 | 0.050 | 0.500 | 1.170 | 0.266 | 4100 | 4880 | 58.2 |
| | 10 | 0.470 | 0.750 | 0.050 | 0.700 | 1.596 | 0.266 | 4138 | 4873 | 56.8 |

TABLE 2

X = 0.73

| | No. | Thickness T (mm) | Resonant frequency fr (kHz) | Antiresonant frequency fa (kHz) | Electromechanical coupling factor % |
|---|---|---|---|---|---|
| Comparative Example 2 | 1 | 1.000 | 1909 | 2280 | 58.6 |
| | 2 | 1.000 | 1902 | 2264 | 57.6 |
| | 3 | 1.000 | 1894 | 2246 | 57.7 |
| | 4 | 0.470 | 4085 | 4820 | 57.0 |
| | 5 | 0.470 | 4100 | 4880 | 58.2 |
| | 6 | 0.470 | 4108 | 4903 | 58.5 |

TABLE 3

X = 0.60

| | No. | Thickness T (mm) | Slit arrangement pitch L (mm) | Slit width D (mm) | Comb portion width L − D (mm) | Ratio of slit arrangement pitch to thickness L/T | Ratio of slit depth to thickness t/T | Resonant frequency fr (kHz) | Antiresonant frequency fa (kHz) | Electromechanical coupling factor % |
|---|---|---|---|---|---|---|---|---|---|---|
| Example 2 | 1 | 1.000 | 0.300 | 0.050 | 0.250 | 0.300 | 0.500 | 1479 | 2091 | 70.3 |
| | 2 | 1.000 | 0.550 | 0.050 | 0.500 | 0.550 | 0.500 | 1448 | 2142 | 73.2 |
| | 3 | 1.000 | 0.800 | 0.050 | 0.750 | 0.800 | 0.500 | 1530 | 2257 | 69.2 |
| | 4 | 0.470 | 0.200 | 0.050 | 0.150 | 0.426 | 0.266 | 3275 | 4437 | 70.4 |
| | 5 | 0.470 | 0.250 | 0.050 | 0.200 | 0.532 | 0.266 | 3570 | 4661 | 69.6 |
| | 6 | 0.470 | 0.350 | 0.050 | 0.300 | 0.745 | 0.266 | 3397 | 4386 | 65.7 |
| Comparative Example 3 | 7 | 1.000 | 1.200 | 0.050 | 1.150 | 1.200 | 0.500 | 1947 | 2327 | 56.3 |
| | 8 | 1.000 | 1.750 | 0.050 | 1.700 | 1.750 | 0.500 | 1974 | 2305 | 55.1 |
| | 9 | 0.470 | 0.550 | 0.050 | 0.500 | 1.170 | 0.266 | 4190 | 4983 | 57.8 |
| | 10 | 0.470 | 0.750 | 0.050 | 0.700 | 1.596 | 0.266 | 4225 | 4975 | 55.7 |

TABLE 4

X = 0.60

|  | No. | Thickness T (mm) | Resonant frequency fr (kHz) | Antiresonant frequency fa (kHz) | Electromechanical coupling factor % |
|---|---|---|---|---|---|
| Comparative Example 4 | 1 | 1.000 | 1955 | 2305 | 56.3 |
|  | 2 | 1.000 | 1970 | 2313 | 57.3 |
|  | 3 | 1.000 | 1960 | 2307 | 57.7 |
|  | 4 | 0.470 | 4159 | 4906 | 56.3 |
|  | 5 | 0.470 | 4191 | 4915 | 57.7 |
|  | 6 | 0.470 | 4170 | 4910 | 57.2 |

TABLE 8

X = 0.66

|  | No. | Thickness T (mm) | Resonant frequency fr (kHz) | Antiresonant frequency fa (kHz) | Electromechanical coupling factor % |
|---|---|---|---|---|---|
| Comparative Example 8 | 1 | 1.000 | 1943 | 2298 | 56.1 |
|  | 2 | 1.000 | 1970 | 2310 | 57.0 |
|  | 3 | 1.000 | 1960 | 2307 | 57.7 |
|  | 4 | 0.470 | 3934 | 4905 | 58.6 |
|  | 5 | 0.470 | 4015 | 4899 | 57.4 |
|  | 6 | 0.470 | 4098 | 4915 | 56.8 |

TABLE 5

X = 0.76

|  | No. | Thickness T (mm) | Slit arrangement pitch L (mm) | Slit width D (mm) | Comb portion width L − D (mm) | Ratio of slit arrangement pitch to thickness L/T | Ratio of slit depth to thickness t/T | Resonant frequency fr (kHz) | Antiresonant frequency fa (kHz) | Electromechanical coupling factor % |
|---|---|---|---|---|---|---|---|---|---|---|
| Example 3 | 1 | 1.000 | 0.300 | 0.050 | 0.250 | 0.300 | 0.500 | 1407 | 1985 | 70.3 |
|  | 2 | 1.000 | 0.550 | 0.050 | 0.500 | 0.550 | 0.500 | 1377 | 2040 | 73.8 |
|  | 3 | 1.000 | 0.800 | 0.050 | 0.750 | 0.800 | 0.500 | 1460 | 2150 | 68.3 |
|  | 4 | 0.470 | 0.200 | 0.050 | 0.150 | 0.426 | 0.266 | 3114 | 4220 | 73.0 |
|  | 5 | 0.470 | 0.250 | 0.050 | 0.200 | 0.532 | 0.266 | 3390 | 4435 | 68.3 |
|  | 6 | 0.470 | 0.350 | 0.050 | 0.300 | 0.745 | 0.266 | 3235 | 4176 | 70.2 |
| Comparative Example 5 | 7 | 1.000 | 1.200 | 0.050 | 1.150 | 1.200 | 0.500 | 1850 | 2210 | 57.3 |
|  | 8 | 1.000 | 1.750 | 0.050 | 1.700 | 1.750 | 0.500 | 1873 | 2187 | 56.2 |
|  | 9 | 0.470 | 0.550 | 0.050 | 0.500 | 1.170 | 0.266 | 3970 | 4733 | 58.3 |
|  | 10 | 0.470 | 0.750 | 0.050 | 0.700 | 1.596 | 0.266 | 4010 | 4720 | 55.9 |

TABLE 6

X = 0.76

|  | No. | Thickness T (mm) | Resonant frequency fr (kHz) | Antiresonant frequency fa (kHz) | Electromechanical coupling factor % |
|---|---|---|---|---|---|
| Comparative Example 6 | 1 | 1.000 | 1923 | 2259 | 56.4 |
|  | 2 | 1.000 | 1920 | 2272 | 57.4 |
|  | 3 | 1.000 | 1921 | 2308 | 59.3 |
|  | 4 | 0.470 | 3922 | 4831 | 57.6 |
|  | 5 | 0.470 | 4089 | 4860 | 56.1 |
|  | 6 | 0.470 | 4058 | 4811 | 56.7 |

TABLE 7

X = 0.66

|  | No. | Thickness T (mm) | Slit arrangement pitch L (mm) | Slit width D (mm) | Comb portion width L − D (mm) | Ratio of slit arrangement pitch to thickness L/T | Ratio of slit depth to thickness t/T | Resonant frequency fr (kHz) | Antiresonant frequency fa (kHz) | Electromechanical coupling factor % |
|---|---|---|---|---|---|---|---|---|---|---|
| Example 4 | 1 | 1.000 | 0.300 | 0.050 | 0.250 | 0.300 | 0.500 | 1405 | 1986 | 71.0 |
|  | 2 | 1.000 | 0.550 | 0.050 | 0.500 | 0.550 | 0.500 | 1376 | 2040 | 73.5 |
|  | 3 | 1.000 | 0.800 | 0.050 | 0.750 | 0.800 | 0.500 | 1450 | 2146 | 68.3 |
|  | 4 | 0.470 | 0.200 | 0.050 | 0.150 | 0.426 | 0.266 | 3104 | 4215 | 70.3 |
|  | 5 | 0.470 | 0.250 | 0.050 | 0.200 | 0.532 | 0.266 | 3393 | 4430 | 68.9 |
|  | 6 | 0.470 | 0.350 | 0.050 | 0.300 | 0.745 | 0.266 | 3227 | 4145 | 66.3 |
| Comparative Example 7 | 7 | 1.000 | 1.200 | 0.050 | 1.150 | 1.200 | 0.500 | 1840 | 2210 | 56.4 |
|  | 8 | 1.000 | 1.750 | 0.050 | 1.700 | 1.750 | 0.500 | 1878 | 2193 | 55.7 |
|  | 9 | 0.470 | 0.550 | 0.050 | 0.500 | 1.170 | 0.266 | 3985 | 4730 | 57.1 |
|  | 10 | 0.470 | 0.750 | 0.050 | 0.700 | 1.596 | 0.266 | 4015 | 4726 | 55.9 |

What is claimed is:

1. A piezoelectric single crystal device that uses a vibration mode in a polarization direction, comprising a comb-shaped structure in which a plurality of slits are formed with a certain pitch on either of device planes whose polarization direction is their normal direction, the slits having a depth extending in a direction substantially perpendicular to the device plane and being filled with an insulating material, wherein an electromechanical coupling factor in a direction parallel to the polarization direction is 65% or more.

2. The piezoelectric single crystal device according to claim 1, wherein the arrangement pitch of the slits is 1.0 time or less the thickness in the polarization direction of the piezoelectric single crystal device, and the depth of the slits is 0.25 to 0.5 times the thickness in the polarization direction of the piezoelectric single crystal device.

3. The piezoelectric single crystal device according to claim 1, wherein the piezoelectric single crystal device is composed of a solid solution having a composition of xPb(A1, A2, B1, B2, ... )O3+(1−x)PbTiO3 (where x is a mol fraction and 0<x<1), where A1, A2, ... is one or more elements selected from the group consisting of Zn, Mg, Ni, Cd, In, Y, and Sc and B1, B2, ... is one or more elements selected from the group consisting of Nb, Ta, Mo, and W, the piezoelectric single crystal device having a complex perovskite structure.

4. The piezoelectric single crystal device according to claim 3, wherein the solid solution constituting the piezoelectric single crystal device further contains 0.5 ppm by mass to 5% by mass of one or more elements selected from the group consisting of Cr, Mn, Fe, Co, Al, Li, Ca, Sr, and Ba.

5. The piezoelectric single crystal device according to claim 2, wherein the piezoelectric single crystal device is composed of a solid solution having a composition of xPb(A1, A2, ..., B1, B2, ... )O3+(1−x)PbTiO3 (where x is a mol fraction and 0<x<1), where A1, A2, ... is one or more elements selected from the group consisting of Zn, Mg, Ni, Cd, In, Y, and Sc and B1, B2, ... is one or more elements selected from the group consisting of Nb, Ta, Mo, and W, the piezoelectric single crystal device having a complex perovskite structure.

* * * * *